United States Patent [19]
Brassington et al.

[11] Patent Number: 5,262,982
[45] Date of Patent: Nov. 16, 1993

[54] NONDESTRUCTIVE READING OF A FERROELECTRIC CAPACITOR

[75] Inventors: Michael P. Brassington, Sunnyvale; Reza Moazzami, Oakland, both of Calif.

[73] Assignee: National Semiconductor Corporation, Santa Clara, Calif.

[21] Appl. No.: 732,115

[22] Filed: Jul. 18, 1991

[51] Int. Cl.$^5$ .............................................. G11C 7/00
[52] U.S. Cl. ...................................... 365/145; 365/149
[58] Field of Search ............... 365/145, 149, 189.07, 365/117, 201

[56] References Cited

U.S. PATENT DOCUMENTS

| | | | |
|---|---|---|---|
| 2,876,435 | 3/1959 | Anderson | 340/173 |
| 2,884,618 | 4/1959 | Epstein | 340/173 |
| 2,926,336 | 9/1960 | Chynoweth | 340/173 |
| 2,955,281 | 10/1960 | Brennemann et al. | 340/173.2 |
| 2,957,164 | 10/1960 | Long et al. | 340/173.2 |
| 3,002,182 | 9/1961 | Anderson | 340/173.2 |
| 3,015,090 | 12/1961 | Landauer | 340/173.2 |
| 3,462,746 | 8/1969 | Bartlett | 340/173.2 |
| 3,599,185 | 8/1971 | Bartlett | 340/173.2 |
| 3,798,619 | 3/1974 | Samofalov et al. | 340/173.2 |
| 3,820,088 | 6/1974 | Hadni et al. | 340/173.2 |
| 4,262,339 | 4/1981 | Geary | 365/145 |
| 4,873,664 | 10/1989 | Eaton | 365/145 |
| 4,888,733 | 12/1989 | Mobley | 365/145 |
| 5,031,143 | 7/1991 | Jaffe | 365/145 |
| 5,086,412 | 2/1992 | Jaffe | 365/145 |

Primary Examiner—Eugene R. LaRoche
Assistant Examiner—A. Zarabian
Attorney, Agent, or Firm—Richards, Medlock & Andrews

[57] ABSTRACT

A circuit and technique for accessing a ferroelectric memory to read polarization states without destruction thereof. A small-amplitude positive polarity pulse is applied to the ferroelectric capacitor, and the resultant positive charge read therefrom. Thereafter, a small-amplitude negative polarity pulse is applied to the ferroelectric capacitor, and the resultant negative charge read therefrom. Because of the nonlinear hysteresis characteristics of the ferroelectric capacitor, the positive and negative readout charges are of different amplitudes. Sense amplifier circuits produce a summation of the positive and negative readout signals, with a resulting summation polarity defining the polarization state initially stored in the ferroelectric capacitor.

37 Claims, 3 Drawing Sheets

READ OF +Pr STATE

READ OF -Pr STATE

NONDESTRUCTIVE READING OF A FERROELECTRIC CAPACITOR

TECHNICAL FIELD OF THE INVENTION

The present invention relates in general to ferroelectric capacitors, and more particularly to the determination of polarization states stored therein without destroying such states.

BACKGROUND OF THE INVENTION

It has long been recognized that ferroelectric material exhibits a hysteresis characteristic and is capable of retaining polarization states even when power is removed from the material. Thin film and integrated circuit capacitors have been fabricated with ferroelectric material to realize the advantages of such material. Ferroelectric capacitors are fabricated by placing a layer of ferroelectric material between two conductive plates. Because the polarization states are stored or retained within the ferroelectric material itself, such states are retained even when the capacitor plates are shorted together.

As a result of the long-term retention properties of ferroelectric capacitors, such capacitors have been integrated as the storage element in semiconductor memories to render such devices nonvolatile. Nonvolatile semiconductor ferroelectric memories can be written with one or the other of a polarization state, and such polarization state is not dissipated or destroyed when the DC voltage or power is removed from the memory. The ferroelectric type of memory thus presents a decided advantage over the conventional dynamic random access memory (DRAM) and the static random access memory (SRAM) which require the presence of a supply voltage to maintain the integrity of the data stored within such type of cells. Although the DRAM and SRAM type of memories can be backed up with a battery as an alternative source of supply voltage, such a combination requires additional space and is economically advantageous in only certain applications.

Conventional ferroelectric memory circuits include a plate or drive line, a bit line, and a number of memory cells comprising a capacitor and a transistor connected between the drive line and the bit line. A particular memory cell is accessed by driving one of the transistors with a selected word line signal, and then driving the drive line with a pulse, generally of the supply voltage magnitude. If one polarization state is stored in the capacitor, then an electrical charge of nominal magnitude is transferred from the capacitor to the bit line. On the other hand, if the ferroelectric capacitor initially stored the other polarization state, a substantially larger electrical charge is transferred to the bit line. Sense amplifier circuits are utilized to sense the bit line voltage, and thus the amount of charge transferred thereto during the read operation, and thereby determine the polarization state initially stored in the ferroelectric capacitor. The smaller amount of charge transferred from the ferroelectric capacitor during the read operation to the bit line does not involve a change in the polarization state of the capacitor itself. Hence, the reading of the ferroelectric capacitor in this state is nondestructive. However, when the read operation of a ferroelectric capacitor is accompanied by the substantially larger transfer of electrical charge to the bit line, the ferroelectric capacitor changes state from the one polarization polarity to the other. In order to circumvent this polarization change, the conventional memory circuits normally include a restore cycle for restoring the original polarization state due to the destructive readout.

Although ferroelectric memory devices are characterized as being nonvolatile, and the destructive read operations can be corrected by simple and often non-complicated restore circuits, such devices are yet susceptible to problems which cannot be corrected. For example, should the power fail or be removed from a conventional ferroelectric memory device during an on-going read operation in which the polarization states change, the ferroelectric capacitor may be in the incorrect state when power is again applied to the memory, thereby storing corrupted data.

As noted above, the read operation of a conventional ferroelectric memory cell often involves the transfer of a substantial electrical charge from the storage capacitor to the bit line. As a result, the timing constraints of the overall memory must be chosen to accommodate a worst case situation in which maximum electrical charge is transferred between the various circuits of the memory array. The time required for charging and discharging the memory circuits resulting from the read and write operations is obviously greater than it would otherwise be for the transferral of smaller electrical charges.

In writing conventional ferroelectric memory cells, the drive line is pulsed with a positive polarity pulse, generally of the supply voltage magnitude, irrespective of the polarization state to be written. However, a sense amplifier connected to the bit line is responsive to the writing of a logic one value or a logic zero value to thereby drive the bit line to the appropriate digital state. As a result, the proper electric field is applied between the drive line and the bit line, and thus across the ferroelectric capacitor to store the appropriate polarization state therein. Sense amplifier design is hereby made more complicated to accommodate both the bit line sensing and driving functions.

In those memory read operations which result in the changing or reversal of ferroelectric capacitor polarization states, the capacitors themselves undergo a phenomenon termed "fatigue", which reduces the life of the capacitor. As a result of fatigue, the reliabiity and life of a ferroelectric capacitor is proportional to the number of times it has been read and/or written According to current developments of ferroelectric material, such material can be read and written a combined number of times of about $10^{12}$. It would be highly advantageous therefore, if ferroelectric capacitors could be read without reversal of the polarization states.

From the foregoing, it can be seen that a need exists for a method and circuits adapted for reading ferroelectric capacitors such that the polarization states are not destroyed or switched to the other state. A related need exists for a ferroelectric memory cell structure which can be read, and which does not require a subsequent restore operation. Another need exist for a ferroelectric memory cell which can be read, and which does not substantially affect the life of the capacitor due to fatigue. Yet another need exists for a simplified technique to write a polarization state within a ferroelectric memory cell, without requiring a sense amplifier to drive a bit line to one or the other digital state.

SUMMARY OF THE INVENTION

In accordance with the present invention, the disclosed ferroelectric memory and method of operation substantially reduce or eliminate the disadvantages and shortcomings associated with the prior art circuits and techniques. According to one aspect of the invention, a ferroelectric capacitor is read by applying a drive pulse of one polarity to one terminal thereof, and then driving such terminal with an opposite polarity drive pulse. The bipolar drive pulse preferably has positive and negative amplitudes which do not cause complete polarization reversal within the ferroelectric capacitor. The reading of the ferroelectric capacitor is thereby nondestructive, irrespective of the polarization state stored in the capacitor. Corresponding positive and negative readout signals are generated at the other terminal of the ferroelectric capacitor in response to the bipolar drive pulses. The positive and negative readout signals are sensed to determine which magnitude readout signal is greater, and the polarity of the greater magnitude signal. Preferably, the positive and negative readout signals are combined in a summation circuit which results in either a net positive output signal, or a net negative output signal. The greater magnitude positive or negative output signal corresponds respectively to a polarization state stored in the ferroelectric capacitor.

When embodied in a memory circuit, the bipolar drive pulse is applied to the drive line, and the combining circuit is preferably integrated into a sense amplifier. The memory cell itself comprises the ferroelectric capacitor and a transistor connected in series between the drive line and the bit line. The bipolar pulse amplitudes are less than half the supply voltage, preferably about 1-2 volts, such magnitude being inadequate to completely switch the capacitor from one polarization state to the other. Notwithstanding, the positive polarity drive pulse transfers a certain amount of capacitor charge to the bit line, and the negative polarity drive pulse transfers a different amount of capacitor charge to the bit line, all depending upon the polarization state of the capacitor.

When the ferroelectric capacitor stores a negative polarization state, the bipolar drive pulse causes the ferroelectric capacitor to transfer a certain amount of positive electrical charge to the bit line, and then a lesser amount of negative electrical charge to the bit line. For a positive polarization state stored in the ferroelectric capacitor, the bipolar drive pulse causes a certain amount of positive electrical charge to be transferred to the bit line, followed by the transfer of a relatively greater amount of negative electrical charge. In the preferred embodiment of the invention, the positive electrical charge transferred is stored in one sense amplifier capacitance, and thereafter the negative electrical charge is stored in a different sense amplifier capacitance. The sense amplifier capacitances are then connected in parallel to provide a summation of the positive and negative charges. The summation signal having either a net positive or negative polarity is compared with a reference voltage, such as circuit common, to produce an output signal having a digital state corresponding to the ferroelectric capacitor polarization state. A net positive summation signal corresponds to one polarization state, while a net negative summation signal corresponds to the other polarization state. In reading either polarization state according to the invention, there is no complete destruction thereof in the ferroelectric capacitor, thereby reducing the fatigue of such capacitor and eliminating the need for a subsequent restore operation after each read operation.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or waveforms throughout the views, and in which.

DETAILED DESCRIPTION OF THE INVENTION

Figure 1:
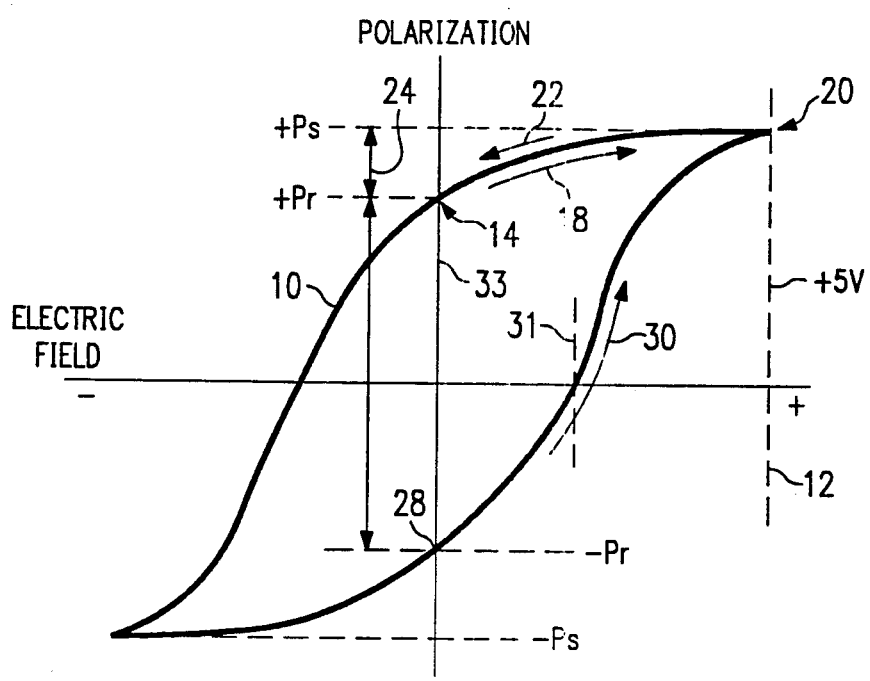
FIG. 1 illustrates the traversal of the hysteresis loop which occurs according to well known techniques for reading ferroelectric capacitors.
Figure 2:
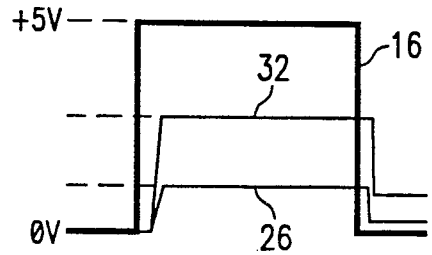
FIG. 2 illustrates a set of electrical waveforms depicting the operation in reading the ferroelectric capacitor according to conventional techniques.

FIG. 1 illustrates a hysteresis loop 10 which is characteristic of ferroelectric capacitors, and the traversal thereof which is conventionally utilized in determining the polarization state thereof. FIG. 2 illustrates a conventional drive signal applied to a ferroelectric capacitor, and the readout voltages corresponding to one or the other polarization state stored by the capacitor.

The horizontal axis of the hysteresis loop 10 defines the magnitude of the electric field applied to the ferroelectric capacitor. The vertical axis of the graph defines the polarization of the ferroelectric capacitor, with $-P_r$ indicating a negative polarization state, and $+P_r$ illustrating a positive polarization state. The $+P_r$ and $-P_r$ polarization states are substantially stable, in that such polarization magnitudes remain even after the voltage is removed from the capacitor. In practice, the $+P_r$ and $-P_r$ states may drift in value somewhat over time. The $+P_s$ and $-P_s$ polarization magnitudes are not stable, in that after the electric field is removed, the magnitudes return from the $P_s$ magnitudes back to the corresponding $P_r$ magnitudes. The vertical broken line 12 illustrates the electric field resulting from the application of $+5$ volts to one terminal of the ferroelectric capacitor.

It is to be assumed, for purposes of example, that a ferroelectric capacitor has been initially set to store the +$P_r$ polarization state, as noted by reference numeral 14, and that a positive bias of five volts is applied to one terminal of the capacitor. The waveform 16 of FIG. 2 illustrates a drive signal effective to apply such an electric field to the capacitor. It is to be understood that the other terminal of the capacitor is not connected to an external drive circuit, but is free to be charged by the capacitor to a voltage depending upon the polarization state of the capacitor. Generally, the other terminal of the ferroelectric capacitor will be connected to some type of circuitry having a parasitic capacitance which is charged by the transfer of electrical charge from the ferroelectric capacitor. On the application of the five volt drive pulse 16, the ferroelectric capacitor undergoes a hysteresis curve transition from the +$P_r$ polarization state 14 in the direction of arrow 18 to polarization magnitude 20 (+$P_s$). When the electric field generated by +5 volt pulse 16 returns to a zero value, as noted by the vertical axis of the curve, the hysteresis loop 10 is traversed in the direction of arrow 22 back to the stable polarization state illustrated by magnitude +$P_r$. The difference in polarization magnitudes experienced by the traversal of the hysteresis loop 10 when a +$P_r$ polarization state 14 is initially stored is shown by dimensional arrow 24. As a result, a small electrical charge is transferred from the ferroelectric capacitor by a corresponding readout signal 26, as illustrated in FIG. 2.

In the event the ferroelectric capacitor has initially stored therein the −$P_r$ stable polarization state, noted by reference numeral 28, a much larger readout signal is generated. Again, when a +5 volt electric bias is applied to the one terminal of the ferroelectric capacitor, as noted by reference numeral 16, the hysteresis loop 10 is traversed from the stable negative polarization magnitude 28 (−$P_r$), along arrow 30 to the positive polarization magnitude 20 (+$P_s$). When the electric field returns to a zero value, the hysteresis loop 10 is traversed along line 22 to the stable positive polarization magnitude +$P_r$. Hence, the original −$P_r$ polarization state of the ferroelectric capacitor has been destroyed as a result of the application of the electric field. It is to be noted that an electric field greater than that shown by numeral 31 applied to a ferroelectric capacitor storing a −$P_r$ state will cause a reversal of the polarization state. An electric field of the magnitude noted by broken line 30 is commonly known as the coercive field of the ferroelectric capacitor. The destructive read results in the complete reversal of the polarity of a large number of material domains within the ferroelectric capacitor, which leads to fatigue and decreased lifetime. The difference in magnitudes between the negative and positive polarization states 28 and 14 gives rise to the generation of a much larger readout signal, as shown in FIG. 2 by reference number 32, and in FIG. 1 by dimensional arrow 33. The relative magnitudes of the readout signals 26 and 32 are a function of the capacitance of the ferroelectric capacitor as well as the external circuits connected thereto. In ferroelectric memory applications, the difference between readout signals 26 and 32 may range from about 60–250 millivolts.

The polarization state of the exemplary ferroelectric capacitor is conventionally determined by comparing the readout signals 26 and 32 with a non-zero reference voltage. One disadvantage of such a scheme is that should the capacitance of the ferroelectric capacitor change over time, or the hysteresis loop characteristic, temperature, etc., or the parasitic capacitance of the bit line change, the magnitudes of the readout signals 26 and 32 can change with respect to the reference voltage. It can be appreciated that the margin for reliable operation is thereby compromised.

The application of the same positive polarity electric field 16 to the ferroelectric capacitor to both store a polarization state, as well as to ascertain the state thereof, is conventional. While not shown, in a memory cell arrangement having a ferroelectric capacitor switchable between a drive line and a bit line, a desired polarization state can be stored in the ferroelectric capacitor by applying a positive drive line voltage to one terminal of the ferroelectric capacitor, and grounding the bit line connected to the other capacitor terminal, and vice versa, to generate the desired polarization state within the capacitor. For example, in order to store the +$P_r$ polarization state 14 within the ferroelectric capacitor, one terminal is driven by the drive line with the positive drive voltage pulse 16, and the other capacitor terminal is grounded by the bit line to store such a polarization state. On the other hand, the −$P_r$ polarization state 28 can be stored within the ferroelectric capacitor by grounding the drive line connected to one terminal of the capacitor, and driving the other terminal of the capacitor by applying a +5 volt pulse to the bit line. In this manner, the full five volt electric field is impressed across the ferroelectric capacitor in a direction to store a −$P_r$ polarization state therein.

Figure 3:
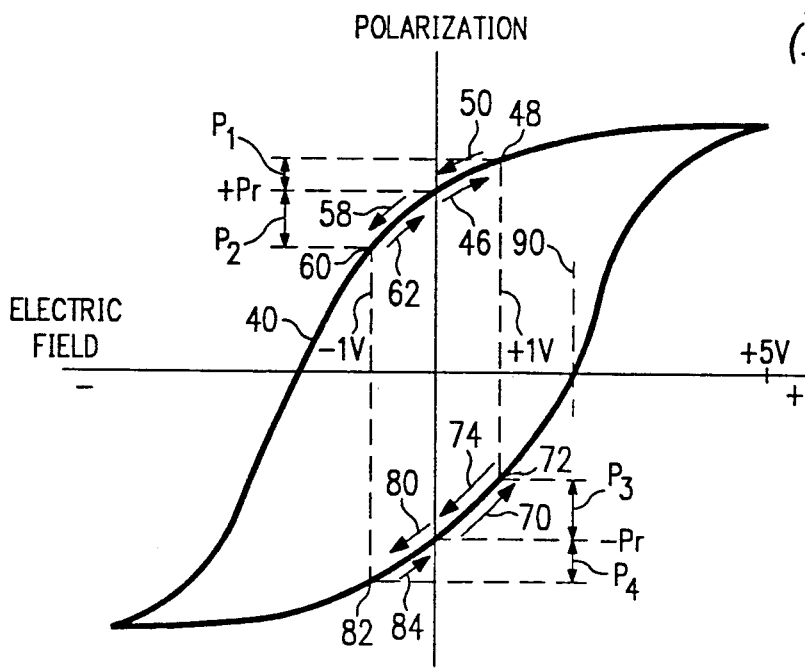
FIG. 3 illustrates a hysteresis loop and various small portions thereof which are traversed in reading a ferroelectric capacitor according to the invention.
Figure 4A:
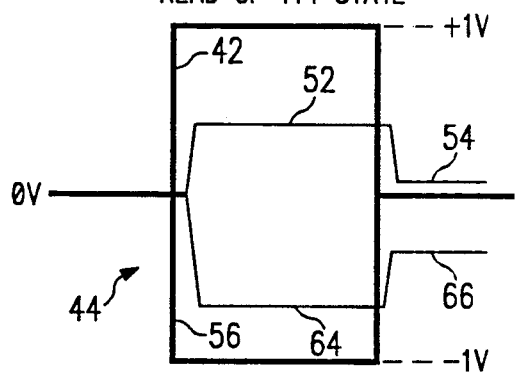
FIGS. 4a and 4b are enlarged electrical waveforms illustrating the bipolar drive pulses and the corresponding readout voltages of the ferroelectric capacitor according to the invention.

FIG. 3 illustrates a hysteresis loop 40 similar to that shown in FIG. 1, but with traversals therealong in accordance with the invention. Assuming again that a +$P_r$ stable polarization state has been stored in the exemplary ferroelectric capacitor, a positive part 42 of a bipolar pulse 44 is applied to one terminal of the capacitor. The positive part 42 of the bipolar pulse 44 is shown in FIG. 4a. Importantly, the magnitude of the applied electric field is made small, about +1 volt in the preferred form of the invention. For purposes of clarity and understanding, the scale of the readout waveforms shown in FIG. 4a is different from that shown in FIG. 2. In response to the application of the small positive electric field to the ferroelectric capacitor, the hysteresis loop 40 is traversed along arrow 46 to point 48, and then back to the +$P_r$ polarization state when the electric field returns to zero. The small change in polarization results in a positive charge transistor proportional in magnitude to P1 shown in FIG. 3. The positive electric charge transferred from the ferroelectric capacitor as a result of the application of the small positive electric field is represented by the readout signal 52 (FIG. 4a), and then drops off to a residual voltage, shown by reference character 54, which remains after removal of the electric field. For further purposes of the present example, it assumed that the magnitude of the positive readout voltage 52 is stored so that it can be subsequently recalled and utilized.

After the application of the positive one volt electric field to the ferroelectric capacitor, the second negative part 56 of the bipolar pulse 44 is applied to the terminal of the ferroelectric capacitor. While FIG. 4a illustrates both positive and negative parts 42 and 56 of the bipolar pulse occurring simultaneously, such depiction is solely for purposes of illustrating the residual readout voltage magnitudes. In practice, the positive and negative electric fields 42 and 56 are applied sequentially in time so that the ferroelectric capacitor experiences an electric field of one polarity, and then the same electric field magnitude of an opposite polarity.

In any event, when the negative polarity part 56 of the bipolar pulse 44 is applied to the same terminal of the ferroelectric capacitor, the hysteresis loop 40 is traversed along arrows 58 to point 60 and then back to the $+P_r$ polarization magnitude via arrow 62. The small negative change in polarization results in a negative charge transfer proportional in magnitude to P2 shown in FIG. 3. The negative magnitude of P2 is greater than the positive magnitude of P1. During the application of the negative polarity electric field 56, the readout voltage comprises a negative polarity signal 64, which thereafter returns to a residual magnitude 66 in the absence of the electric field. As can be seen from the nonlinear portion of the hysteresis loop between points 48 and 60, the positive readout magnitude 52 is less than the negative readout magnitude 64. Thus, when combining the readout magnitudes 52 and 64 by summing or adding such magnitudes, a net negative polarity will result. The negative polarity summation result thus corresponds to the initial storage of a positive polarization state $+P_r$ in the ferroelectric capacitor. The polarization magnitude remaining in the ferroelectric capacitor after traversals between hysteresis loop points 48 and 60 is somewhat less than the original polarization magnitude $+P_r$. Indeed, after a number of such traversals, the ferroelectric capacitor may require refreshing to restore the ferroelectric capacitor back to the original $+P_r$ magnitude. After perhaps 10,000 ferroelectric capacitor read operations, a refresh cycle can be carried out in the manner described below.

Figure 4B:
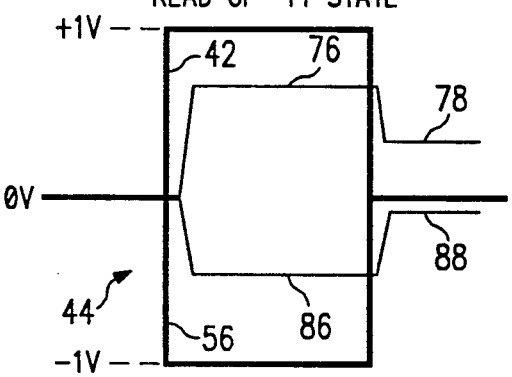

In the event a negative stable polarization state $-P_r$ is stored in the ferroelectric capacitor, and when driven by one volt magnitude bipolar pulses as shown in FIG. 4b, an opposite polarity summation signal is realized, indicating the storage of the opposite polarization state. More particularly, when the positive polarity part 42 of the bipolar drive pulse 44 is applied to the one terminal of the ferroelectric capacitor, the hysteresis loop 40 is traversed along arrow 70 to point 72 and then back to the $-P_r$ stable state along arrow 74. As a result, a positive readout signal generated during the bipolar part 42 rises to a positive level 76 and then returns to a residual positive magnitude as indicated by waveform 78. The small positive change in polarization results in a positive charge transfer proportional in magnitude to P3 shown in FIG. 3. When the negative part 56 of the bipolar drive pulse 44 is applied to the ferroelectric capacitor, the hysteresis loop 40 is traversed along arrow 80 to point 82, and then returned to the $-P_r$ stable state along arrow 84. The small negative change in polarization results in a negative charge transfer proportional in magnitude to P4 shown in FIG. 3. It is noted that the positive magnitude of P3 is greater than the negative magnitude of P4. As a result, the readout signal during the negative part 56 of the drive pulse rises to a negative level indicated by reference numeral 86, and then returns to a residual negative magnitude as shown by numeral 88. In visually comparing the waveforms of FIG. 4b, the positive readout magnitude 76 is larger than the negative readout magnitude 86. Again, when the positive and negative readout magnitudes 76 and 86 are combined in a summation circuit, a net positive polarity signal results, thereby indicating the storage of a negative polarization state $-P_r$ in the ferroelectric capacitor. As with the $+P_r$ polarization state, the original $-P_r$ polarization magnitude is gradually reduced after a number of traversals between points 72 and 82 on the hysteresis loop 40. Ferroelectric restoration techniques are described more fully below.

From the foregoing, it can be seen that by applying a bipolar pulse of a selected magnitude to a ferroelectric capacitor, the polarization state thereof can be determined without a complete destruction of the polarization state. A bipolar pulse having positive and negative magnitudes less than that shown by numeral 90 (i.e., the coercive field) does not result in complete polarization reversals. While the bipolar readout pulses applied to the ferroelectric capacitor have been described in terms of 1-2 volt magnitudes, it is contemplated that bipolar magnitudes as small as about 0.1 volt to 0.5 volt can be utilized, depending on the type of ferroelectric film, circuit noise and sense amplifier design. In the preferred embodiment of the invention, a smaller than necessary voltage is applied to the ferroelectric capacitor to reduce the number of material domains which are switched and thereby reduce fatigue, but yet obtain sufficient magnitude readout signals to distinguish them from memory array noise. By traversing the hysteresis loop 40 between points 48 and 60, no polarization state reversal is experienced, but the polarization state can nevertheless be determined by summing the positive and negative readout signals and ascertaining the resultant net polarity. The same technique is carried out in determining the negative polarity polarization state, except such state is defined by an opposite polarity summation result. In addition, by applying an electric signal such that the hysteresis loop 40 is traversed between points 48 and 60, as well as between points 72 and 82, relatively fewer domains are switched in the ferroelectric material, as compared to the prior art technique. Accordingly, the ferroelectric capacitor experiences much less fatigue, thereby reducing the life of capacitor to a lesser extent. Yet another advantage of the technique of the invention is that by applying a smaller magnitude electric field to the ferroelectric capacitor, the corresponding pulses can be of smaller width, thereby reducing access time.

While the foregoing sets forth the drive pulses and readout signals in terms of positive and negative polarities, it is to be understood that such terms are taken to be relative to each other. In other words, a ferroelectric memory device may be supplied only with a positive supply voltage. In such event, the various circuits can be constructed such that the positive and negative drive pulses have, for example, +3 volts and +1 volt magnitudes respectively. Voltage translation circuits may be required to make the digital states of memory chip compatible with other chips. In addition, on-chip charge pump circuits and techniques may be utilized to generate negative voltages from a positive supply voltage. Also, while the reading of the exemplary ferroelectric capacitor has been described in terms of a positive drive pulse followed by a negative drive pulse, the drive sequence can be reversed.

Figure 5:
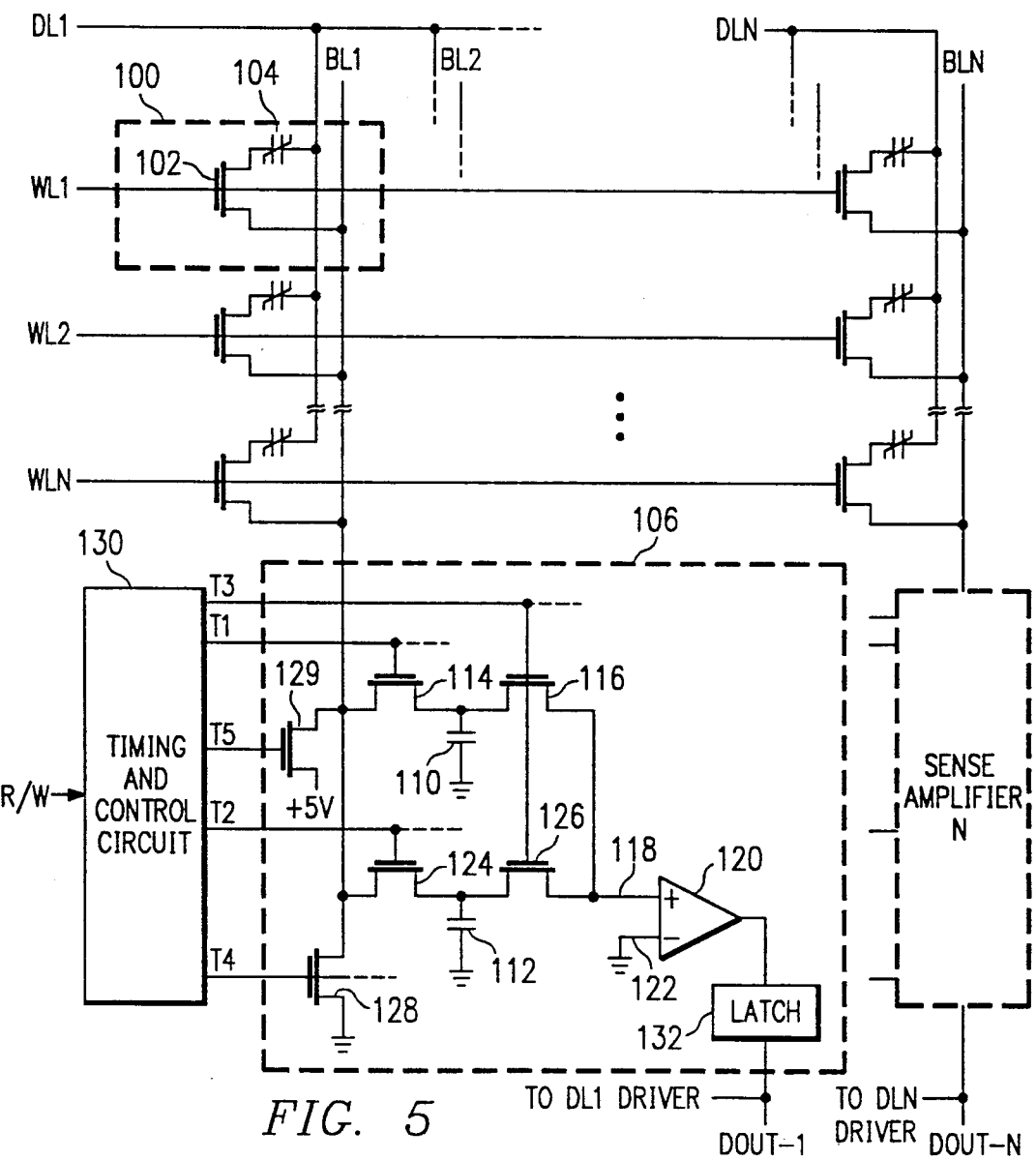
FIG. 5 illustrates in detailed electrical schematic form, a ferroelectric memory array and associated sense amplifiers according to the invention.

FIG. 5 illustrates a portion of a ferroelectric memory array constructed in accordance with the preferred embodiment of the invention. The memory array preferably includes a number of columns, each associated with a drive line, such as DL1-DLN. The columns are arbitrarily shown as being vertically oriented. The array also includes a number of rows, each associated with a word line, such as WL1-WLN. At the intersection of each column and row there is formed in the array a memory cell 100, defined by a transistor switch 102 connected in series with a ferroelectric capacitor 104. The memory cell 100 is shown with an N-channel MOS transistor 102 having a gate terminal connected to the word line WL1. The series-arranged transistor 102 and ferroelectric capacitor 104 are connected between the drive line DL1 and a bit line BL1, both of which extend in the array parallel to each other. A particular memory cell, such as cell 1, is accessed in the array by decoding one drive line (DL1) of the many drive lines, and one word line (WL1) of the many word lines, whereupon a particular memory cell 100 is selected for reading or writing a polarization state.

The basic operation of the ferroelectric memory in carrying out a write operation is that the word line WL1 is selected, whereupon the transistor 102 is driven into conduction. The ferroelectric capacitor 104 is thus connected between the drive line DL1 and the bit line BL1. In order to write a positive $+P_r$ polarization state in the selected ferroelectric capacitor 104, the voltage on the bit line BL1 is established at a logic low value, and then the drive line DL1 is pulsed with a positive drive pulse to thereby establish a $+P_r$ polarization state in the ferroelectric capacitor 104. The logic low voltage can be applied to the bit line by driving transistor 128 with a T4 timing pulse generated by the timing and control circuit 130. The other polarization state ($-P_r$) can be set in the ferroelectric capacitor 104 by maintaining the voltage on the DL1 drive line at a logic low value, and driving the bit line BL1 with a positive voltage. The bit line BL1 can be driven to a positive voltage by driving transistor 129 with a T5 pulse, also generated by the timing and control circuit 130.

A polarization state previous set in the ferroelectric capacitor 104 can also be determined, or read, by driving the word line WL1 to a logic high state, and pulsing the drive line DL1 with a bipolar pulse. As a result of pulsing the drive line DL1 in a positive and negative direction, and depending upon the polarization state previously set in the ferroelectric capacitor 104, a certain amount of electrical charge is transferred from the ferroelectric capacitor 104 to the bit line BL1. A sense amplifier 106 associated with the array column is effective to temporarily store the positive and negative electrical charges generated by the respective positive and negative drive pulses, and to thereafter add such electrical charges. The sense amplifier 106 then determines the net polarity of the added electrical charges to thereby determine the polarization state of the ferroelectric capacitor 104. Importantly, the reading of the ferroelectric memory cell 100 is nondestructive, in that neither of the polarization states capable of being stored are completely destroyed. As a result, a refresh operation is not required after each read operation, and the fatigue of the capacitor is substantially reduced due to less domain switching.

The sense amplifier 106 according to the invention is associated with the memory array column having cell 100, and is shown connected to the bit line BL1. The sense amplifier 106 further includes a first storage capacitor 110 for temporarily storing the electrical charge read from the memory cell 100 in response to a positive polarity drive line pulse 42 (FIG. 4a). A second storage capacitor 112 is effective to store the electrical charge read from the memory cell 100 in response to the negative polarity drive line pulse 56. The capacitors 110 and 112 can be discrete capacitors fabricated with the other components of the sense amplifier 106, or can be parasitic capacitances. The capacitance values of the capacitors 110 and 112 are ideally equal, but can be of a nominal value of about that of the ferroelectric cell capacitors.

The first storage capacitor 110 has one terminal which is connected to circuit common, or ground, and another terminal connectable to the bit line BL1 by an N-channel MOS transistor 114. The storage capacitor 110 is also connectable by an N-channel transistor 116 to a noninverting input 118 of an operational amplifier 120. The inverting input 122 of the amplifier 120 is connected to a zero reference voltage, such as circuit common. With the foregoing construction, the first capacitor 110 can be connected to the bit line BL1 when transistor 114 is driven into conduction, or can be isolated therefrom. In like manner, the capacitor 110 can be connected by transistor 116 to the input node 118 of the amplifier 120, or can be isolated therefrom. The second storage capacitor 112 is similarly connectable to the bit line BL1 and the amplifier input node 118 by respective transistors 124 and 126. Accordingly, the second storage capacitor 112 can be either connected or isolated with respect to the bit line BL1 or the noninverting input node 118 of the amplifier 120. When both storage capacitors 110 and 112 are connected to the amplifier input 118, they are connected in parallel to each other.

As will be described in more detail below, transistor 114 has a gate terminal driven by a timing and control circuit 130, and particularly with a signal denoted as T1. Transistor 124 which connects the second storage capacitor 112 to the bit line BL1, is driven by a T2 timing pulse which is also generated by the timing and control circuit 130. Transistors 116 and 126 which connect the respective capacitors 11 and 112 to the amplifier input node 118 are driven together by a T3 timing pulse. The sense amplifier 106 further includes an N-channel transistor 128 connected between the bit line BL1 and circuit common. When driven into conduction by a T4 timing pulse, the transistor 128 effectively grounds the bit line BL1 to discharge any electrical charge which may be stored in the parasitic capacitance associated therewith. As noted above, N-channel transistor 129 is driven by a T5 timing pulse to precharge the bit line BL1 to a logic high voltage. A latch 12 is connected to the output of the amplifier 120 for providing a latched data output DOUT-1. Alternatively, the latch 132 in each sense amplifier can be eliminated, and each data out DOUT terminal of all the sense amplifiers can be connected to a common latch to provide a single data output of the array.

Figure 6:
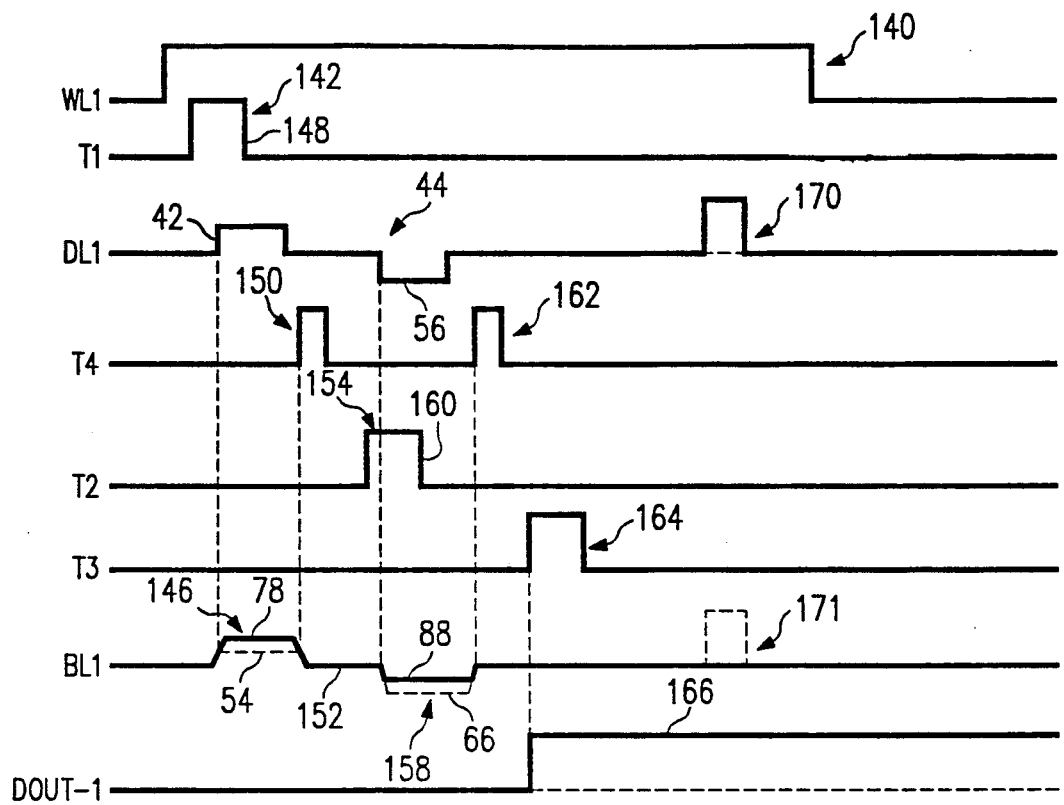
FIG. 6 is a number of electrical waveforms for controlling the memory array of FIG. 5 in accordance with the method of the invention.

The detailed operation of the memory array is described with respect to the circuit of FIG. 5 in conjunction with the waveforms of FIG. 6. Those skilled in the art can readily devise of a timing and control circuit 130 which is effective to generate many of the waveforms shown in FIG. 6. In addition, those skilled in the art can readily devise of drive line timing circuits for generating the drive line signal, also shown in FIG. 6. For purposes of illustration, the following example assumes that the memory cell 100 is selected for first reading a $-P_4$ polarization state of the ferroelectric capacitor 104, and then a $+P_r$ state. The other memory cells in the array can be selected and read in a similar manner.

In selecting memory cell 100, a word line decoder (not shown) decodes a memory address and drives the selected word line WL1 to a logic high level, such as shown by waveform 140. The logic high level can be that which is supplied by a supply voltage to the memory circuit, such as a five volt level. The logic high word line signal 140 drives the cell transistor 102 into conduction, thereby connecting the ferroelectric capacitor 104 between the drive line DL1 and the bit line BL1. Next, the timing and control circuit 130 generates a T1 timing pulse, such as shown by waveform 142. The logic high level of the T1 pulse 142 drives the sense amplifier transistor 114 into conduction, thereby connecting the first storage capacitor 110 to the bit line BL1. The T2 timing signal remains at a logic low level, thereby isolating the second storage capacitor 112 from the bit line BL1. In the timing sequence, a drive line decoder (not shown) decodes the memory address and drives the DL1 drive line with a small amplitude positive polarity part 42 of the bipolar pulse 44. In the preferred embodiment of the invention, the magnitude of the positive pulse 42 is insufficient to cause complete switching of the polarization state of the ferroelectric capacitor 104, and is preferably about one volt. Depending upon the characteristics of the ferroelectric capacitor 104, and particularly the shape of the hysteresis loop 40, other small magnitude voltages can be utilized in driving the drive line DL1 with the positive pulse 42 without causing polarization reversals. As noted above, the rising edge of the positive part 42 of the bipolar pulse 44 causes the traversal 70 along the hysteresis loop 40, and further causes an electrical charge to be transferred from the ferroelectric capacitor 104 to the bit line BL1. This charge transferral is shown by the bit line waveform 146 in FIG. 6. The solid line indicates the transfer of a certain amount of electrical charge transferred to the bit line BL1 in response to the reading of a $-P_4$ polarization state, while the broken line shows a lesser amount of charge transferred in response to the reading of a $+P_4$ polarization state previously stored in the ferroelectric capacitor 104.

Because the sense amplifier transistor 114 is conductive during this period of time, the electrical charge transferred from the ferroelectric capacitor 104 to the bit line BL1 charges the first storage capacitor 110 in an amount depending upon its capacitance and the parasitic capacitance of the bit line BL1. Importantly, because the drive line DL1 is driven by the positive pulse 42, the first storage capacitor 11 is charged to a positive voltage corresponding to the amount of charge transferred from the bit line BL1 thereto. On the negative-going transition 148 of the T1 timing pulse, the sense amplifier transistor 114 is cut off, thereby isolating the charged storage capacitor 110 from the bit line BL1. The negative going transition 148 of the T1 timing pulse preferably occurs during the middle to latter portion of the positive polarity pulse 42.

Occurring next in the timing sequence is a narrow T4 timing pulse 150 which drives the sense amplifier transistor 128 into conduction. The bit line BL1 is thereby grounded to remove any residual charge thereon which resulted from the positive drive line pulse 42. The bit line waveform portion 152 is shown discharged to a circuit common potential. Next occurring in the timing sequence is the generation by the timing and control circuit 130 of a T2 timing pulse 154. The rising edge of the T2 timing pulse 154 to a logic high level is effective to drive sense amplifier transistor 124 into conduction, thereby connecting the second storage capacitor 112 to the bit line BL1. Subsequent to the rising edge of the T2 timing pulse 154, the drive line DL1 is driven with a small amplitude negative polarity pulse 56. The amplitude of the negative polarity pulse 56 is preferably the same as the positive polarity pulse 42, although this is not absolutely essential. The initial negative-going transition of the negative polarity drive line pulse 56 causes a traversal 80 of the hysteresis loop 40 and an amount of electrical charge to be transferred from the ferroelectric capacitor 104 to the bit line BL1. As a result, a negative electrical charge is transferred from the ferroelectric capacitor 104 to the bit line BL1, as shown by waveform 158. As noted above, the solid waveform illustrates the transfer of charge when a $-P_r$ polarization state was initially stored in the ferroelectric capacitor 104, while the broken line illustrates the charge transferred when a $+P_r$ polarization state was initially stored. As described above, because of the nonlinear nature of the hysteresis loop 40, the electrical charge transferred to the bit line BL1 from the ferroelectric capacitor 104 in response to the bipolar pulses 42 and 56 is unequal in magnitude, thereby providing a mechanism for determining the initial polarization state. Again, the charge transferred to the bit line BL1 in response to the negative drive pulse 56 charges the second storage capacitor 112 to a voltage which is a function of the amount of charge transferred to the bit line BL1, and the size of the capacitor 112 in comparison to the parasitic capacitance of the bit line BL1.

During the time when the negative polarity part 56 of the bipolar pulse 44 is applied to the drive line DL1, the T2 timing pulse 154 returns to a logic low level, as shown by signal transition 160. As a result, sense amplifier transistor 124 is cut off and isolates the charged second storage capacitor 112 from the bit line BL1. After the T2 timing pulse returns to a logic low level, the first storage capacitor 110 has stored therein a positive voltage having a magnitude depending upon the particular polarization state stored in the ferroelectric capacitor 104. Similarly, the second storage capacitor 112 has a negative voltage stored therein which is characterized by an amplitude, also corresponding to the particular polarization state stored in the ferroelectric capacitor 104.

Continuing with the timing sequence, the timing and control circuit 130 generates a second T4 timing pulse 162 which again drives transistor 128 into conduction for discharging the bit line BL1. This discharge is in preparation for subsequent read or write operations of the array column. Although the T4 timing pulse is shown occurring prior to the end of a read cycle, it can be generated near the end of such cycle to avoid delays in obtaining data read from the accessed cell.

Subsequent to the generation of the second T4 timing pulse 162, the timing and control circuit 130 generates a T3 pulse 164. When the T3 timing pulse 164 transitions to a logic high level, sense amplifier transistors 116 and 126 are both driven into conduction, thereby connecting the first storage capacitor 110 and the second storage capacitor 112 to the noninverting input node 118 of the amplifier 120. Input node 118 of the amplifier 120 is characterized by a high impedance, and thus the amplifier input discharges substantially no current from either of the storage capacitors 110 or 112. Rather, because transistors 116 and 126 are both driven into the conductive state, the storage capacitors 110 and 112 are connected in parallel. The parallel connection of storage capacitors 110 and 112 causes the respective stored positive voltage and negative voltage to be distributed between such capacitors, thereby effectively adding or summing the voltages. In other words, the net voltage or charge distributed on both storage capacitors 110 and 112 will eventually be equal, but will have the same polarity as the highest amplitude positive or negative polarity voltage stored on the respective capacitors 110 and 112. Stated another way, if a $-P_r$ polarization state was initially stored in the ferroelectric capacitor 104, a resulting read operation would cause storage capacitor 110 to store a larger amplitude positive voltage than the negative voltage stored on the second storage capacitor 112. When connected in parallel, the net voltage which results and is coupled to the amplifier input node 119 will be positive, thereby denoting the initial storage of a negative polarization state. On the other hand, if a $+P_4$ polarization state were initially stored in the ferroelectric capacitor 104, a greater magnitude negative polarity voltage would be stored on the second storage capacitor 112, as compared to the positive polarity voltage stored on the first storage capacitor 110. A net negative voltage will result and will be coupled to the amplifier input node 111, thereby signifying that a positive polarization state was initially stored in the ferroelectric capacitor 104.

The operational amplifier 120 is shown operating in a noninverting manner, and thus the output digital state signifies an opposite polarization state of the ferroelectric capacitor 104. The operational amplifier 120 can, of course, be connected to operate in an inverting mode, whereby the output digital states correspond to the ferroelectric capacitor polarization states. It should be understood that the correspondence between the ferroelectric capacitor polarization stages and digital logic levels are entirely arbitrary.

With reference back to FIG. 6, it is seen that the rising transition of the T3 timing pulse 164 is effective to connect the storage capacitors 110 and 112 in parallel and cause a summation of the storage capacitor voltages. A resulting polarity defines a logic level corresponding to a polarization state, and the amplifier 120 drives a latch 132 into a latched condition. The data out signal DOUT-1 is shown driven to a logic high level 166, which level corresponds to the polarization state stored in the ferroelectric capacitor 104. While not shown, the latch 132 can be reset by the timing and control circuit 130 in preparation for a subsequent memory operation. The broken line associated with the DOUT-1 signal corresponds to a logic low level which would result if the other polarization state had been stored in the ferroelectric capacitor 104. The readout of such other polarization state would have resulted in the bit line voltages, also shown by broken lines.

The sense amplifier 106 is shown having the output data terminal DOUT-1 connected back to the drive line DL1 driver. The feedback connection to the DL1 driver is shown at the output of the latch 132, although such connection could be at other sense amplifier circuit points. The use of such feedback to the DL1 driver enables such driver to drive the drive line DL1 with a refresh pulse having a polarity dependent upon the data state presented at the output of the sense amplifier 106. In other words, if the output of the sense amplifier latch 132 is a logic high level, then the drive line DL1 is driven with a positive polarity refresh pulse, and vice versa. In accordance with another feature of the invention, subsequent to each memory read operation of a cell, such cell is refreshed. Refreshing of a memory cell is carried out by applying a large amplitude drive line voltage of the appropriate polarity to rewrite the original polarization state within the memory cell and assure that substantially all domains are aligned in the same direction. The details of refreshing ferroelectric memory cells are described in more detail in copending U.S. patent application Ser. No. 642,022, filed Jan. 16, 1991, and assigned to the assignee hereof.

Drive line and bit line refresh pulses are shown by reference numerals 170 and 171 in FIG. 6. The refresh pulses shown in solid line are effective to refresh $+P_r$ polarization states, while the refresh pulses 170 and 171 shown in broken lines are effective to refresh $-P_r$ polarization states. With the word line WL1 yet at a logic high level, and with the bit line BL1 discharged to a circuit common voltage level by sense amplifier transistor 128, the application of a positive $+5$ volt refresh pulse 170 to the drive line DL1 will reestablish the respective $+P_r$ polarization state in the accessed ferroelectric capacitor. The refresh pulse 170 preferably has an amplitude of about $+5$ volts such that the hysteresis loop 40 transitions to the far right thereof, thereby assuring that substantially all domains of the ferroelectric material are polarized in the same direction. In a like manner, a $-P_r$ polarization state can be refreshed by maintaining the drive line DL1 at near zero volts, and driving sense amplifier transistor 129 into conduction so that the bit line is driven with a supply voltage pulse 171. When refreshed in this manner, the far left portion of the hysteresis loop is traversed to restore the $-P_r$ polarization state.

Figure 7:
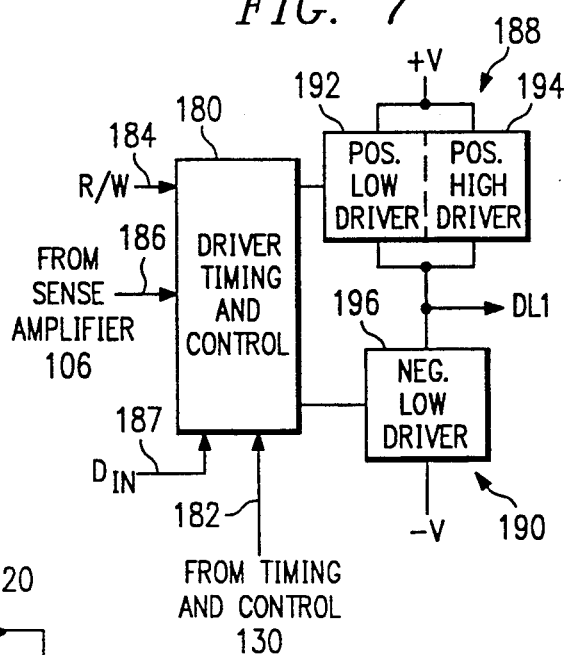
FIG. 7 illustrates in block diagram form a circuit adapted for driving the drive line according to the invention.

FIG. 7 illustrates in block diagram form circuitry for generating drive line signals for driving the memory array in accordance with the invention. A driver timing and control circuit 180 is associated either with each drive line driver circuit of an array column, or controls all the column drivers. The driver timing and control 180 includes an input 182 from the sense amplifier timing circuit 130 to coordinate the sense amplifier timing with the drive line timing. It should be appreciated that all the timing circuits of the memory array are synchronized so that all memory operations can be carried out in a coordinated manner. Further, the driver timing and control 180 includes a read/write input 184 so that timing signals can be generated in accordance with read and write signals coupled to the memory. A feedback input 186 is coupled to the driver timing and control circuit i from the sense amplifier 106 so that appropriate refresh pulse amplitude can be generated, depending upon the digital state read from a particular memory cell. Lastly, a Data in (Din) input 187 is connected to the control circuit 180 so that appropriate amplitude drive signals can be generated to cause appropriate polarization states to be stored in correspondence with the digital states input to the memory during write commands.

The driver timing and control 180 generates signals which are coupled to a positive driver circuit 188. The positive driver circuit 188 includes a positive low driver 192 and a positive high driver 194. The positive low driver 192 is effective to generate the low amplitude positive polarity signals which comprise a portion of the bipolar read pulses described above. The positive high driver 194 is effective to generate positive polarity pulses of magnitude substantially equal to the supply voltage for write and refresh purposes. The negative polarity driver 190 includes a negative low driver 196 for producing low amplitude negative polarity pulses for driving the drive line during read operations.

In response to a read command of a particular memory cell, the driver timing and control circuit 180 generates a timing signal coupled to the positive low driver 192 for producing the low amplitude positive pulse 42 shown in FIG. 6. After a predetermined delay, the driver timing and control 180 generates another signal for enabling the negative low driver 196 to generate the low amplitude negative polarity pulse 56.

Drive line pulses effective to write particular polarization states of any ferroelectric memory cell are accomplished by the drive timing and control circuit 180 triggering the positive high driver 194 with appropriate timing signals. For example, if a $+P_r$ polarization state is to be established in a ferroelectric memory cell, then the positive high driver 194 would be enabled at the appropriate time in the memory write sequence. As noted above, if a $-P_r$ polarization state is to be written into a memory cell, the drive line DL1 is maintained at near zero volts, while the bit line BL2 is pulsed to a positive voltage.

Lastly, a positive refresh pulse 170 substantially of the supply voltage magnitude can be generated by the positive high driver 194. However, and as noted above, the presence or absence of such a refresh pulse 170 depends upon the state of the signal previously read from the accessed memory cell. Accordingly, the latched output of the associated sense amplifier is coupled to the input 186 of the driver timing and control circuit 180 to thereby provide the driver circuit with the state last read from the accessed memory cell. Based upon the digital state on the input 186, the driver timing and control 180 can then select either the positive high driver 194 for driving the drive line DL1 with a positive polarity refresh pulse 170, or maintain the drive line at a zero voltage.

While separate positive and negative drivers are shown, such drivers can be integrated into a single driver circuit. For example, the positive high driver can comprise a single MOS transistor coupled through a resistance to the positive supply voltage. The series resistance can, in turn, be paralleled with another transistor for short circuiting such resistance. When it is desired to drive the drive line with a high magnitude voltage, the resistance can be shorted with the other transistor, thereby coupling essentially the full supply voltage to the drive line. On the other hand, when a low magnitude voltage is desired, such as during a read operation, the transistor shorting the resistance remains off, whereby the full supply voltage is prevented from being coupled to the drive line. The value of the series resistance determines the magnitude of the drive voltage with which the drive line is driven. The negative low driver 190 can be similarly structured. Those skilled in the art can devise of many other schemes for driving the drive lines with bipolar and unipolar pulses.

Figure 8:
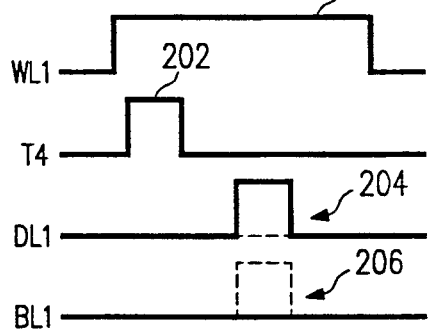
FIG. 8 depicts a number of waveforms utilized according to the invention for writing a ferroelectric memory cell with a desired polarization state.

With reference now to FIG. 8, there are shown a number of waveforms which are effective to carry out a write operation of a selected ferroelectric memory cell. In writing a memory cell, the associated word line, such as WL1, is driven to a logic high level 200. After the word line is selected and driven, the sense amplifier timing and control circuit 130 generates a T4 timing pulse 202 to discharge the bit line BL to ground, or to a circuit common level. Thereafter, the driver timing and control 180 generates a timing signal 204 to drive the positive high driver 194 so that the appropriate amplitude signal is generated on the drive line DL1. The bit line is controlled in the converse manner so that the appropriate polarity voltage is applied across the ferroelectric capacitor to store the desired polarization state. For example, if a digital zero value is to be written into the accessed memory cell, a positive polarity pulse of the supply voltage magnitude is generated for driving the drive line DL1, and the bit line is maintained at a ground voltage. As noted above, the data states to be written are coupled to the driver timing and control circuit 180 (FIG. 7) on input 187. If, on the other hand, a digital one value is to be written into the memory cell, a zero magnitude voltage is applied to the drive line DL, while the bit line is pulsed to the supply voltage, as noted by numeral 206. As noted above, a digital zero value, as appearing on the data out terminal of the sense amplifier 106 corresponds to a positive polarization state $(+P_r)$, while a digital one value corresponds to a negative polarization state $(-P_r)$. As can be appreciated, the writing of digital states within the ferroelectric memory of the invention is simplified, and only requires the appropriate pulses applied to the drive lines and bit lines.

Figure 9:
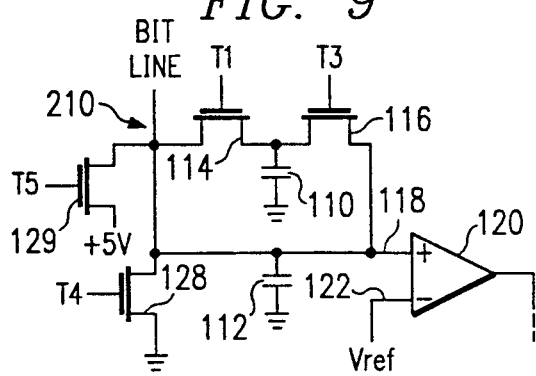
FIG. 9 is a detailed schematic diagram of a sense amplifier according to an alternate embodiment of the invention.

FIG. 9 illustrates an alternative embodiment of a sense amplifier 210, adapted for sensing bit line readout signals generated during the bipolar drive pulses, and combining the readout signals to ascertain a resulting polarity which is representative of the polarization state stored in the ferroelectric capacitor 104. This embodiment is similar to that shown in FIG. 5, except the transistors 124 and 126 have been removed, thereby permitting the second storage capacitor 112 to be conducted directly to the bit line and the noninverting input node 118 of the amplifier 120. Because of the elimination of such transistors, the T2 timing pulse is also not required. Rather than connecting the noninverting amplifier input 122 to circuit common, such input is preferably connected to a non-zero reference voltage VREF. The reference voltage VREF is preferably selected to be about midway between the combined readout voltages which appear on the noninverting amplifier input 118 which result from the reading of the opposite polarization states of the ferroelectric capacitor 104. The signal waveforms effective for reading the ferroelectric memory cell with the sense amplifier 210 are substantially the same as shown in FIG. 6, except with the elimination of T2 waveform and the second T4 pulse. The operation of the sense amplifier 210 is carried out in the following manner.

After a positive polarity portion of a bipolar pulse has been applied to the ferroelectric capacitor 104 such that a corresponding readout signal appears on the bit line, the T1 timing pulse is applied to allow the first storage capacitor 110 to be charged. The T1 timing pulse is effective to drive transistor 114 into conduction and connect the first storage capacitor 110 to the bit line. In this embodiment of the sense amplifier 210, the occurrence of the T1 timing pulse causes the first and second storage capacitors 11 and 112 to be connected in parallel during the first charging sequence. As a result, because a finite amount of charge is transferred from the ferroelectric capacitor 104 to the bit line, the first storage capacitor 110 will be charged to about half what it would be, as compared to the sense amplifier configuration 106 shown in FIG. 5. After the T1 timing pulse returns to a logic low level, the transistor 114 isolates the first storage capacitor 110 from the bit line. The T4 timing pulse is then effective to drive the transistor 128 into conduction and discharge the bit line to a zero voltage level.

A negative polarity drive pulse generated by the driver timing and control circuit 180 is applied to the accessed ferroelectric capacitor 104 and is effective to generate a negative polarity readout signal on the bit line. The bit line readout signal charges the second storage capacitor 112 to a negative voltage, the magnitude of which depends on the polarization state stored in the ferroelectric capacitor 104. The occurrence of the T3 timing pulse then causes the first storage capacitor 110 and the second storage capacitor 112 to be connected in parallel and effectively sums the signals stored in such capacitors. However, in this instance, the storage signals are not symmetrical and thus it is contemplated that a non-zero reference voltage is required for comparing by the operational amplifier 120. Notwithstanding, an appropriate reference voltage can be utilized to distinguish between summation signals resulting from the readout of one polarization state, and summation signals resulting from the readout of an opposite polarization state. The output of the amplifier 120 thus yields an indication of the polarization state stored in the ferroelectric capacitor. Subsequent to the T3 timing pulse, another T4 timing pulse can optionally be generated to discharge the bit line in preparation for subsequent memory operations.

In brief summary, and as noted above, read operations carried out in accordance with the invention are facilitated by the use of a bipolar drive pulse, i.e., a pulse having a positive polarity pulse followed by a negative polarity pulse, or vice versa. While it may appear that the use of a bipolar pulse may require additional time in reading a memory, it should be appreciated that the amplitude of such pulse is small, and therefore less electrical charge is transferred from the accessed ferroelectric capacitor. With less charge transferred to the bit line, the RC time constants involved are less, and thus the pulse width of the drive pulses can be narrower than traditional drive line pulses which transfer substantially larger electrical charges. It is therefore contemplated that read access times of a memory utilizing the principles and concepts of the invention will not be greater, if at all, than access times of conventional ferroelectric memories. Another technical advantages realized by the invention is that changes in the ferroelectric capacitor characteristics, and other electrical characteristics of the array, do not substantially affect the ability of the sense amplifier to discriminate between polarization states. In other words, the sense amplifier of the invention preferably does not utilize a non-zero reference voltage to discriminate between two positive voltages, but rather uses a ground or zero voltage reference to discriminate between a positive and negative polarity voltage. To that end, the sensing technique of the invention is self-referencing and need only distinguish between positive and negative polarities. Another important technical advantage of the invention is that since read operations are nondestructive of the polarization states, power failures occurring during read operations do not corrupt the data, as can occur in conventional ferroelectric memories. Another technical advantage presented by the invention is that by refreshing data subsequent to read operations, the reliability and life of the ferroelectric material is substantially extended.

While the preferred embodiment and other embodiments of the invention have been disclosed with reference to specific memory structures and methods of operation, it is to be understood that many changes in detail may be made as a matter of engineering choices, without departing from the spirit and scope of the invention, as defined by the appended claims.

What is claimed is:

1. A method of determining a polarization state of a ferroelectric capacitor exhibiting hysteresis characteristics, comprising the steps of:
    applying a first electric field of a first polarity to the ferroelectric capacitor to produce a first readout signal of a first polarity and a first magnitude;
    applying a second electric field of a polarity different from that of the first electric field, across the ferroelectric capacitor to produce a second readout signal of a polarity different from that of the first readout signal;
    combining electrical charges resulting from the first and second readout signals to produce a resultant signal representative of the polarization state stored in the ferroelectric capacitor; and
    comparing the resultant signal with a reference voltage to produce an output digital state representative of the polarization state stored in the ferroelectric capacitor.

2. The method of claim 1, further including summing the first readout signal with the second readout signal to produce a resultant polarity representative of the polarization state stored in the ferroelectric capacitor.

3. The method of claim 1, further including producing said first and second readout signals and storing a voltage representative of each said readout signal, and thereafter combining said stored voltages.

4. The method of claim 1, further including storing the first and second readout voltages in respective capacitances, and electrically isolating one said capacitance from the other during a predefined period of time.

5. The method of claim 4, further including connecting said capacitances in parallel during another predefined period of time to produce said resultant signal.

6. The method of claim 5, further including comparing the resultant signal with said reference voltage to produce said output digital state representative of the polarization state stored in the ferroelectric capacitor.

7. The method of claim 6, further including comparing the resultant signal with a circuit common potential.

8. The method of claim 1, further including applying electric fields each of a magnitude such that the ferroelectric capacitor does not switch said polarization state during the determination of the stored polarization state.

9. A method for determining a polarization sate of a ferroelectric capacitor memory cell exhibiting a hysteresis characteristic, comprising the steps of:
    applying a word line signal to access the memory cell;
    applying a drive line voltage of a magnitude insufficient to change the polarization state to one plate of the ferroelectric capacitor of the memory cell, said drive line voltage having a first polarity pulse followed by a second pulse having a polarity different from said first polarity pulse;
    generating a first capacitor readout signal on a bit line in response to the first polarity pulse;
    generating a second capacitor readout signal on the bit line in response to the second polarity pulse; and
    combining the first and second readout signals together to derive a resultant signal for use in determining the polarization state of the ferroelectric capacitor memory cell without destroying the polarization state.

10. The method of claim 9, further including carrying out the combining step by adding together the first and second readout signals.

11. The method of claim 9, further including storing the first and second capacitor readout signals, each having an opposite polarity.

12. The method of claim 11, further including combining the readout signals by summing the readout signals together to produce a summer signal, and comparing the summed signal with a reference voltage to determine which of said readout signals has a greater magnitude.

13. The method of claim 9, further including writing the ferroelectric capacitor with a first polarization state by applying a first polarity voltage across the ferroelectric capacitor, and writing an opposite polarization state by applying a second polarity voltage across the ferroelectric capacitor.

14. A ferroelectric memory circuit for carrying out the method of claim 9.

15. A method for determining a polarization state of a ferroelectric capacitor exhibiting hysteresis characteristics, comprising the steps of:
  applying an electric field across the ferroelectric capacitor of a first polarity and of such a magnitude that switching of the polarization state thereof does not occur, and producing a first readout signal;
  applying an electric field across the ferroelectric capacitor of a second polarity different from said first polarity and of such a magnitude that switching or a polarization state thereof does not occur, and producing a second readout signal; and
  determining the polarization state of the ferroelectric capacitor by combining the first readout signal having a defined magnitude and polarity with the second readout signal having a different polarity to obtain a resultant polarity, and assigning the polarization state based upon the resultant polarity.

16. The method of claim 15, further including generating the first readout signal in response to the electric field having the first polarity, and generating the second readout signal in response to the electric field having the second polarity.

17. The method of claim 15, further including charging a first storage capacitor with the first readout signal, and charging a second storage capacitor with the second readout signal.

18. The method of claim 17, further including connecting the storage capacitors in parallel to effectively produce a resultant summation signal having a polarity corresponding to the polarization state stored in said ferroelectric capacitor.

19. A ferroelectric memory for carrying out the method of claim 15.

20. A nonvolatile ferroelectric memory, comprising:
  a drive line;
  a bit line;
  at least one memory cell having a ferroelectric capacitor in series with a transistor switch, said cell being connected between said drive line and said bit line;
  a word line connected to said memory cell for controlling the transistor switch;
  a sense amplifier circuit connected to said bit line, said sense amplifier circuit including,
    a first storage capacitor for storing a first readout signal from said ferroelectric capacitor;
    a second storage capacitor for storing a second readout signal from said ferroelectric capacitor;
    isolation means for isolating said first and second storage capacitors from each other; and
    combining means for combining the charge stored in said first and second storage capacitors; and
    amplifier means for amplifying a signal representative of the combined charge to provide a digital output signal representative of a polarization state of the ferroelectric capacitor.

21. The nonvolatile memory of claim 20, wherein isolation means comprises a first transistor for isolating said first storage capacitor from said bit line, and a second transistor for isolating said second storage capacitor from said first storage capacitor.

22. The nonvolatile memory of claim 21, further including a third transistor for isolating the second storage capacitor from said bit line, and a fourth transistor for isolating said second storage capacitor from said amplifier means.

23. The nonvolatile memory of claim 22, wherein each gate terminal of said second and fourth transistor is connected together.

24. The nonvolatile memory of claim 22, wherein said first and third transistors are driven into conduction at different times so that respective electrical charges can be stored sequentially in said first storage capacitor and then in said second storage capacitor.

25. The nonvolatile memory of claim 20, further including a driver for driving said drive line with a bipolar pulse applied to said ferroelectric capacitor to thereby generate said first and second readout signals.

26. The nonvolatile memory of claim 25, further including a feedback connection between said sense amplifier and said drive line driver so that a refresh voltage of desired magnitude can be applied to said ferroelectric capacitor based on said polarization state stored in said ferroelectric capacitor.

27. The nonvolatile memory of claim 20, further including a driver for driving said drive line with a voltage having a magnitude insufficient to switch said polarization state of the ferroelectric capacitor during a read operation.

28. The nonvolatile memory of claim 27 wherein said driver generates bipolar pulses.

29. The nonvolatile memory of claim 20, further including a driver for driving the drive line with bipolar pulses having a first magnitude during writing of the ferroelectric capacitor, and having a different magnitude during reading thereof.

30. The nonvolatile memory of claim 29, wherein the driver generates during read operations said bipolar pulses that have a magnitude less than a magnitude of the drive pulses that are generated during write operations of the ferroelectric capacitor.

31. The nonvolatile memory of claim 30, wherein said driver generates drive pulses for refreshing said ferroelectric capacitors.

32. The nonvolatile memory of claim 31, wherein said driver generates small amplitude bipolar pulses during memory read operations, and subsequent thereto said driver generates a higher magnitude pulse for refreshing an accessed memory cell.

33. A ferroelectric memory for carrying out the method of claim 1.

34. Apparatus for determining a polarization state of a ferroelectric capacitor memory cell exhibiting a hysteresis characteristic, comprising:
  means for applying a word line signal to access the cell;
  means for applying a drive line voltage to one plate of the ferroelectric capacitor of the memory cell, said drive line voltage having a first polarity pulse followed by a second different polarity pulse;

means for generating a first ferroelectric capacitor readout signal on a bit line in response to the first polarity pulse;

means for generating a second ferroelectric capacitor readout signal on the bit line in response to the second polarity pulse; and means for combining together electrical charges representative of the first and second readout signals to determine a resultant first or second polarity that corresponds to the polarization state of the ferroelectric capacitor.

35. The apparatus of claim 34, further including a comparator for comparing the resultant first or second polarity with a reference voltage to determine the polarization state.

36. The apparatus of claim 35, further including a zero volt reference voltage generator.

37. The apparatus of claim 35, further including a nonzero reference voltage.

* * * * *

UNITED STATES PATENT AND TRADEMARK OFFICE
CERTIFICATE OF CORRECTION

PATENT NO. :   5,262,982

DATED      :   November 16, 1993

INVENTOR(S) :  Michael P. Brassington, et al.

It is certified that error appears in the above-identified patent and that said Letters Patent is hereby corrected as shown below:

Col. 18, line 47, change "sate" to --state--.

Col. 19, line 6, change "summer" to --summed--.

Col. 19, line 27, change "or" to --of--.

Col. 20, line 7, after "wherein", insert --said--.

Signed and Sealed this

Twenty-second Day of November, 1994

Attest:

BRUCE LEHMAN

Attesting Officer

Commissioner of Patents and Trademarks